(12) United States Patent
Ogawa et al.

(10) Patent No.: US 11,482,665 B2
(45) Date of Patent: Oct. 25, 2022

(54) SEMICONDUCTOR DEVICE

(71) Applicant: ABLIC Inc., Chiba (JP)

(72) Inventors: Yohei Ogawa, Chiba (JP); Hirotaka Uemura, Chiba (JP)

(73) Assignee: ABLIC INC., Chiba (JP)

( * ) Notice: Subject to any disclaimer, the term of this patent is extended or adjusted under 35 U.S.C. 154(b) by 233 days.

(21) Appl. No.: 16/807,813

(22) Filed: Mar. 3, 2020

(65) Prior Publication Data

US 2020/0313081 A1 Oct. 1, 2020

(30) Foreign Application Priority Data

Mar. 28, 2019 (JP) .............................. JP2019-064312
Sep. 27, 2019 (JP) .............................. JP2019-177122

(51) Int. Cl.
*H01L 43/06* (2006.01)
*G01R 33/07* (2006.01)
*H01L 43/04* (2006.01)

(52) U.S. Cl.
CPC .......... *H01L 43/065* (2013.01); *G01R 33/077* (2013.01); *H01L 43/04* (2013.01)

(58) Field of Classification Search
CPC ...... H01L 43/065; H01L 43/04; G01R 33/077
See application file for complete search history.

(56) References Cited

U.S. PATENT DOCUMENTS

| 9,116,192 B2 | 8/2015 | Stahl-Offergeld et al. |
|---|---|---|
| 2012/0212216 A1 | 8/2012 | Stahl-Offergeld et al. |
| 2013/0057256 A1* | 3/2013 | Ernst .................. G01R 33/0005 324/202 |
| 2013/0138372 A1 | 5/2013 | Ausserlechner |
| 2013/0300406 A1 | 11/2013 | Pepka et al. |
| 2017/0336481 A1 | 11/2017 | Latham et al. |

OTHER PUBLICATIONS

The Extended European Search Report in Europe Application No. 20164009.1, dated Aug. 14, 2020, 7 pages.

* cited by examiner

*Primary Examiner* — Latanya N Crawford Eason
(74) *Attorney, Agent, or Firm* — Crowell & Moring LLP

(57) ABSTRACT

A semiconductor device includes a semiconductor substrate: a vertical Hall element formed in the semiconductor substrate, and having a magnetosensitive portion; a first excitation wiring disposed above the magnetosensitive portion, and configured to apply a first calibration magnetic field (M1) to the magnetosensitive portion; and second excitation wirings disposed above the magnetosensitive portion on one side and on another side of the first excitation wiring, respectively, along the first excitation wiring as viewed in plan view from immediately above a front surface of the semiconductor substrate, and configured to apply second calibration magnetic fields (M2) to the magnetosensitive portion.

11 Claims, 8 Drawing Sheets

SEMICONDUCTOR DEVICE

RELATED APPLICATIONS

This application claims priority to Japanese Patent Application Nos. 2019-064312, filed on Mar. 28, 2019 and 2019-177122, filed on Sep. 27, 2019, the entire content of which is incorporated herein by reference.

BACKGROUND OF THE INVENTION

1. Field of the Invention

The present invention relates to a semiconductor device.

2. Description of the Related Art

There has been known a semiconductor device using a I-fall element, for example, as a magnetic sensor. The Hall elements have been used in various applications as magnetic sensors capable of detecting a position or an angle in a non-contact manner. The Hall elements include a vertical Hall element and a horizontal Hall element. Of those, the horizontal Hall element is a magnetic sensor which detects a magnetic field component perpendicular to an element surface, while the vertical Hall element is a magnetic sensor which detects a magnetic field component parallel to the element surface. Further, there has been proposed a magnetic sensor in which the horizontal Hall element and the vertical Hall element are combined to two-dimensionally or three-dimensionally detect a magnetic field.

The above-mentioned vertical Hall element is, however, affected more easily by manufacturing variation than the horizontal Hall element, and is more liable to exhibit large variation in sensitivity and offset voltage characteristic than the horizontal Hall element.

The following method has been proposed to calibrate such characteristic variation. In the method an excitation wiring is disposed near the vertical Hall element, and a magnetic field of a predetermined intensity (hereinafter referred to as "calibration magnetic field") is generated by the constant current flowing through the excitation wiring so as to apply to a magnetosensitive portion of the vertical Hall element, and estimate the sensitivity of the magnetosensitive portion (see, for example, U.S. Pat. No. 9,116,192). Specifically, the invention described in U.S. Pat. No. 9,116,192 is directed to the estimation of an actual sensitivity of the magnetosensitive portion by changing the intensity of the calibration magnetic field and measuring a change in Hall voltage generated from the vertical Hall element.

Further, according to the invention described in U.S. Pat. No. 9,116,192, the center position of the excitation wiring is laterally offset from the center position of the magnetosensitive portion in the vertical Hall element, that is, the center position of the excitation wiring and the center position of the magnetosensitive portion are laterally spaced apart from each other.

This arrangement reduces variation in intensity of the calibration magnetic field generated by the excitation wiring due to variation in, for example, the width of the excitation wiring caused by process fluctuation in manufacturing a semiconductor device.

However, in the invention described in U.S. Pat. No. 9,116,192, the excitation wiring and the magnetosensitive portion are laterally spaced apart from each other. That is, since an intensity of a calibration magnetic field generated by the current flowing through the excitation wiring is inversely proportional to a distance from the excitation wiring, the longer the distance between the magnetosensitive portion and the excitation wiring becomes, the lower the intensity of the calibration magnetic field applied to the magnetosensitive portion becomes.

As the intensity of the calibration magnetic field applied to the magnetosensitive portion becomes lower, a change in Hall voltage generated from the vertical Hall element becomes smaller. Thus, with the invention described in U.S. Pat. No. 9,116,192, even though the variation in intensity of the calibration magnetic field to be applied to the magnetosensitive portion can be reduced, accuracy of estimating the actual sensitivity of the magnetosensitive portion lowers since the intensity of the calibration magnetic field is low.

The amount of current flowing through the excitation wiring can be increased, to thereby increase the intensity of the calibration magnetic field applied to the magnetosensitive portion. However, as the amount of current flowing through the excitation wiring becomes larger, the amount of heat generated by the excitation wiring becomes larger.

Further, with the invention described in U.S. Pat. No. 9,116,192, since the center position of the excitation wiring is laterally offset from the center position of the magnetosensitive portion by a large amount, peripheral circuits disposed around the magnetosensitive portion are close to the excitation wiring. In this case, the peripheral circuits are affected by the heat from the closely located excitation wiring. Specifically, since the heat generation in the excitation wiring causes asymmetric temperature distribution in each peripheral circuit, characteristics of each peripheral circuit fluctuate. Accordingly, the increase in amount of current caused to flow through the excitation wiring similarly leads to the lowered accuracy of estimating the actual sensitivity of the magnetosensitive portion.

By increasing a distance between the excitation wiring and each peripheral circuit, the fluctuation of characteristics of each peripheral circuit can be suppressed. However, this is not a practical solution because an increase in an area required for the semiconductor device leads to an increase in cost.

SUMMARY OF THE INVENTION

It is an object of the present invention to provide a semiconductor device capable of increasing an intensity of a calibration magnetic field applied to a magnetosensitive portion, and capable of suppressing variation in the intensity.

In order to achieve the above-mentioned object, a semiconductor device according to at least one embodiment of the present invention includes a semiconductor substrate; a vertical Hall element formed in the semiconductor substrate, and having a magnetosensitive portion; a first excitation wiring disposed above the magnetosensitive portion, and configured to apply a first magnetic field to the magnetosensitive portion; and second excitation wirings disposed above the magnetosensitive portion, and side by side on one side and another side of the first excitation wiring, respectively, as viewed in plan view from immediately above a front surface of the semiconductor substrate, and configured to apply second magnetic fields to the magnetosensitive portion.

According to the semiconductor device of the present invention, through superimposing the first magnetic field and the second magnetic fields, the intensity of the calibration magnetic field applied to the magnetosensitive portion can be increased, and the calibration magnetic field adjusted to have a more uniform intensity can be applied to the magnetosensitive portion. As a result, it is possible to increase the intensity of the calibration magnetic field applied to the magnetosensitive portion, and to suppress variation in the intensity.

DETAILED DESCRIPTION OF THE PREFERRED EMBODIMENTS

Now, embodiments of the present invention are described in detail below with reference to the drawings.

In some of the drawings referred to in the following description, characteristic portions are enlarged for convenience and easy understanding thereof, and each component is not necessarily drawn to scale. Further, left, right, upper, and lower directions, or other directions used in the following description are defined based on the illustration. Further, materials and dimensions given in the following description are merely examples. The present invention is not necessarily limited thereto and can be implemented with appropriate modifications without departing from the gist thereof.

First Embodiment

Figure 1:
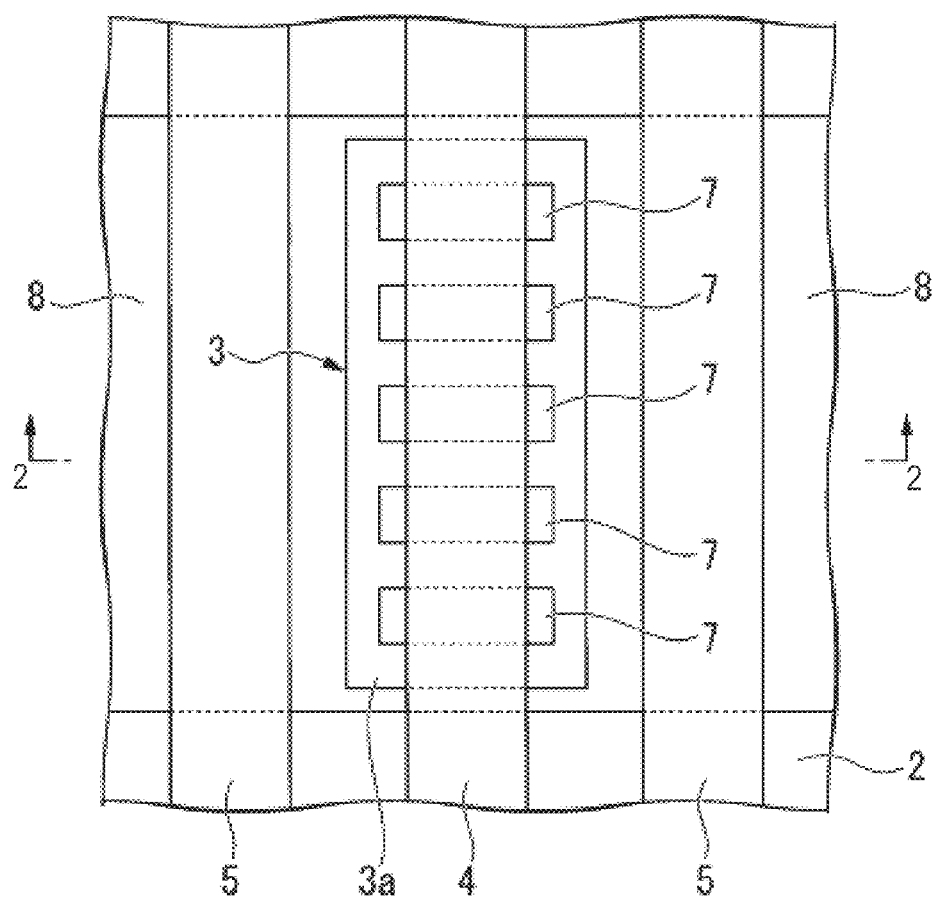
FIG. 1 is a plan view for illustrating a configuration of a semiconductor device according to the first embodiment of the present invention.
Figure 2:
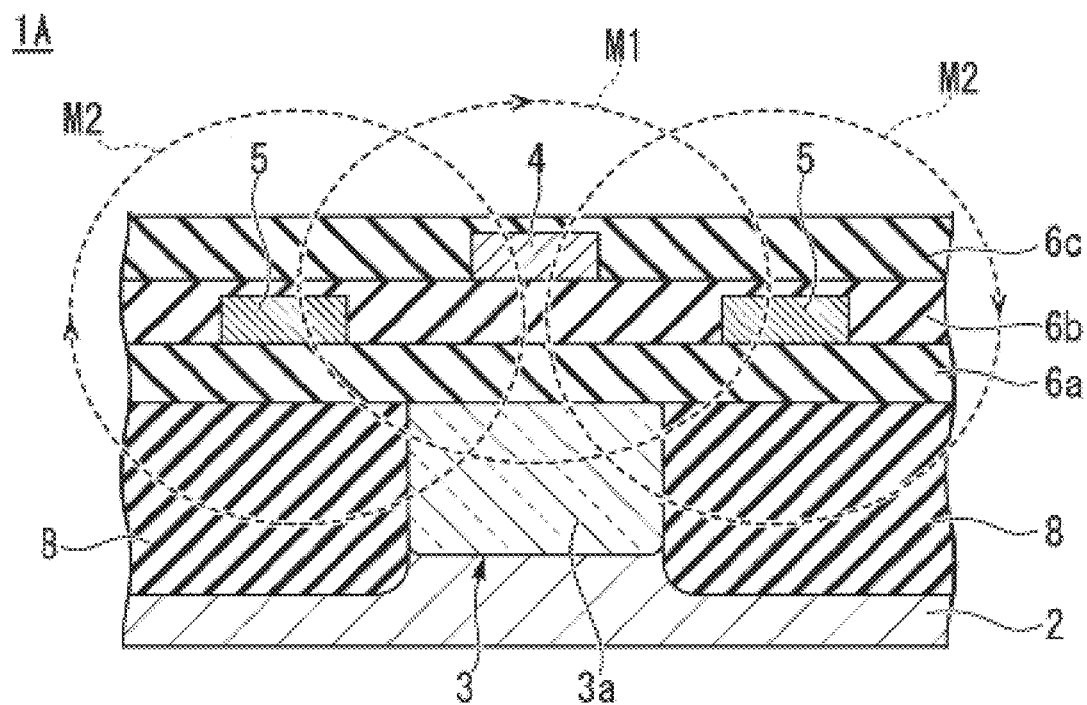
FIG. 2 is a sectional view of the semiconductor device taken along the line 2-2 of FIG. 1.

As the first embodiment of the present invention, a semiconductor device 1A illustrated in FIG. 1 and FIG. 2 is now described.

FIG. 1 is a plan view for illustrating a configuration of the semiconductor device 1A. FIG. 2 is a sectional view of the semiconductor device A taken along the line 2-2 of FIG. 1.

As illustrated in FIG. 1 and FIG. 2, the semiconductor device 1A according to the first embodiment includes a semiconductor substrate 2, a vertical Hall element 3 formed in the semiconductor substrate 2, an excitation wiring 4 disposed above the vertical Hall element 3, and two excitation wirings 5 disposed on both sides of the excitation wiring 4 as viewed in plan view from immediately above a front surface as a top surface of the semiconductor substrate 2 (hereinafter simply referred to as the "plan view").

The vertical Hall element 3 has a magnetosensitive portion 3a which detects a magnetic field component parallel to an element surface, and a plurality of (in the first embodiment, five) electrodes 7 having a predetermined length in the width direction of the magnetosensitive portion 3a (that is, the short-side direction of the magnetosensitive portion 3a). The magnetosensitive portion 3a is, for example, a semiconductor layer (well) formed from the semiconductor substrate 2 of the first conductivity type (for example, P type) which is one of a P type and an N type by implanting impurities of the second conductivity type (for example, N type) which is the other one of the P type and the N type. The magnetosensitive portion 3a has a function of detecting a magnetic field component parallel to the element surface. Above the magnetosensitive portion 3a, the electrodes 7 are provided in parallel in the long-side direction of the magnetosensitive portion 3a. With the magnetic field component parallel to the element surface applied to the magnetosensitive portion 3a, a Hall voltage corresponding to the magnetic field component is generated between the electrodes 7 of the vertical Hall element 3.

The vertical Hall element 3 is electrically isolated from other regions of the semiconductor substrate 2 by the diffusion layer 8 surrounding the magnetosensitive portion 3a. The semiconductor substrate 2 includes, in the other regions, a circuit for processing an output signal from the vertical Hall element 3, a circuit for supplying current to the vertical Hall element 3 a circuit for compensating the characteristic of the vertical Hall element 3 with a calibration magnetic field, and the like as peripheral circuits.

Further, on the front surface of the semiconductor substrate 2, interlayer insulating layers 6a, 6b, and 6c which provide electrical insulation among the vertical Hall element 3, the excitation wiring 4, and the excitation wirings 5 are formed. The interlayer insulating layer 6a is formed to cover one surface of the semiconductor substrate 2. The excitation wirings 5 as the second excitation wirings are disposed on the interlayer insulating layer 6a. The interlayer insulating layer 6b is formed on the interlayer insulating layer 6a to cover the excitation wirings 5. The excitation wiring 4 as the first excitation wiring is disposed on the interlayer insulating layer 6b. The interlayer insulating layer 6c is formed on the interlayer insulating layer 6b to cover the excitation wiring 4.

The excitation wiring 4 is disposed above the vertical Hall element 3 and extends in the long-side direction of the vertical Hall element 3. Further, the excitation wiring 4 is disposed immediately above the magnetosensitive portion 3a to overlap a center portion of the magnetosensitive portion 3a as viewed in plan view. As a result, a center position in the width direction of the excitation wiring 4 matches a center position in the width direction of the magnetosensitive portion 3a.

From the viewpoint of applying a calibration magnetic field that is uniform in the width direction of the magnetosensitive portion 3a to the magnetosensitive portion 3a, the width of the excitation wiring 4 may be set in consideration of a distance from a front surface of the magnetosensitive portion 3a and a width of the magnetosensitive portion 3a as appropriate. For example, in the semiconductor device 1A illustrated in FIG. 1, the width of the excitation wiring 4 is set to substantially half the width of the magnetosensitive portion 3a.

Further, it is preferred that the width of the excitation wiring 4 is half the width of the magnetosensitive portion 3a or more. With the width of the excitation wiring 4 set to half the width of the magnetosensitive portion 3a or more, the calibration magnetic field that is uniform in the width direction of the magnetosensitive portion 3a can be applied to the magnetosensitive portion 3a irrespective of the distance from the front surface of the magnetosensitive portion 3a.

The two excitation wirings 5 are disposed in parallel to each other in the same interlayer insulating layer 6b and extend above the vertical Hall element 3 in the long-side direction of the vertical Hall element 3. In other words, the two excitation wirings 5 are disposed in parallel to form a pair in the same interlayer insulating layer 6b. Further, the two excitation wirings 5 are disposed symmetrically with respect to the excitation wiring 4 on the left side as one side and the right side as another side as viewed in plan view. Further, the two excitation wirings 5 are disposed on outer sides of the magnetosensitive portion 3a as viewed in plan view.

In the semiconductor device 1A according to the first embodiment, the excitation wiring 4 is disposed above the two excitation wirings 5. Further, the excitation wiring 4 is formed to have the same width as the width of each of the two excitation wirings 5.

In the semiconductor device 1A according to the first embodiment having the above-mentioned configuration, a calibration magnetic field M1 excited around the excitation wiring 4 by the constant current flowing through the excitation wiring 4 is applied to the magnetosensitive portion 3a. Further, calibration magnetic fields M2 excited around the excitation wirings 5 by the constant current flowing through each of the excitation wirings 5 are applied to the magnetosensitive portion 3a.

Figure 3:
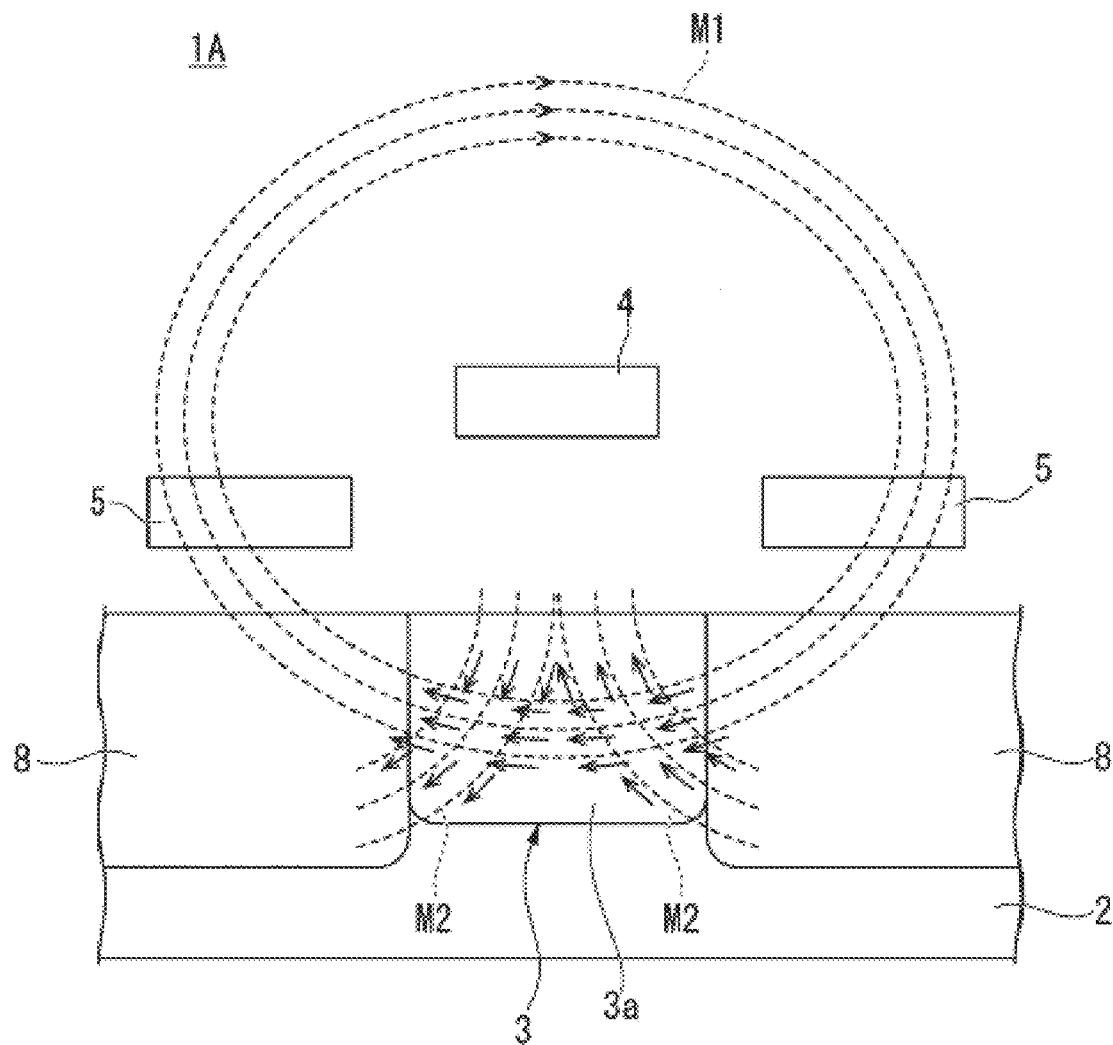
FIG. 3 is a sectional view for schematically illustrating calibration magnetic fields applied to a magnetosensitive portion in the semiconductor device illustrated in FIG. 1.

Now, the calibration magnetic fields M1 and M2 applied to the magnetosensitive portion 3a are described with reference to FIG. 3. FIG. 3 is a sectional view of the semiconductor device 1A for schematically illustrating the calibration magnetic fields M1 and M2 applied to the magnetosensitive portion 3a. In FIG. 3, from the viewpoint of ensuring clarity of the figure, for example, the interlayer insulating layers 6a, 6b, and 6c are omitted. Further, in FIG. 3, magnetic field lines of the calibration magnetic fields M1 and M2 are indicated by the broken lines, and directions of the calibration magnetic fields M1 and M2 applied to the magnetosensitive portion 3a are indicated by the arrows.

As illustrated in FIG. 3, since the calibration magnetic field M1 excited around the excitation wiring 4 spreads concentrically from the excitation wiring 4, the intensity of the calibration magnetic field M1 applied to the magnetosensitive portion 3a is relatively low in both end portions in the width direction than in the center portion of the magnetosensitive portion 3a.

Meanwhile, since the calibration magnetic fields M2 excited around the excitation wirings 5 spread concentrically from the excitation wirings 5, the intensity of each of the calibration magnetic fields M2 applied to the magnetosensitive portion 3a is relatively high in each of both end portions in the width direction than in the center portion of the magnetosensitive portion 3a.

Further, the intensity of the calibration magnetic field M1 as the first magnetic field has a magnetic field component in the direction parallel to the front surface of the semiconductor substrate 2 that is highest at the front surface of the semiconductor substrate 2, and that becomes lower farther away from the front surface of the semiconductor substrate 2 in the depth direction.

Meanwhile, the intensity of each of the calibration magnetic fields M2 as the second magnetic fields has a magnetic field component in the direction perpendicular to the front surface of the semiconductor substrate 2 that is highest at the front surface of the semiconductor substrate 2, and most of the magnetic fields have the magnetic field component in the direction perpendicular to the front surface of the semiconductor substrate 2. Further, the intensity of each of the calibration magnetic fields M2 has the magnetic field component in the direction horizontal to the front surface of the semiconductor substrate 2 that becomes higher farther away from the front surface of the semiconductor substrate 2 in the depth direction. In other words, the magnetic field component horizontal to the front surface of the semiconductor substrate 2 of each of the calibration magnetic fields M2 is low at the front surface of the semiconductor substrate 2, and becomes higher farther away from the front surface of the semiconductor substrate 2 in the depth direction.

To the magnetosensitive portion 3a, a calibration magnetic field obtained by superimposing the calibration magnetic field M1 and the calibration magnetic fields M2 is applied. Further, since the excitation wiring 4 is arranged immediately above the magnetosensitive portion 3a, the calibration magnetic field M1 that has a higher magnetic field intensity than in the related art is applied to the magnetosensitive portion 3a. Consequently, with the semiconductor device 1A according to the first embodiment, the intensity of the calibration magnetic field applied to the magnetosensitive portion 3a can be increased, and the calibration magnetic field adjusted to have a more uniform intensity can be applied to the magnetosensitive portion 3a.

In order to adjust the calibration magnetic field, arrangement of the excitation wirings 4 and 5 and a magnitude of the current flowing through each of the excitation wirings 4 and 5 may be adjusted. Through this adjustment, the calibration magnetic field having the more uniform intensity can be applied throughout the magnetosensitive portion 3a.

Here, in the semiconductor device 1A according to the first embodiment, uniformity in the width direction and the depth direction of the calibration magnetic fields applied to the magnetosensitive portion 3a is simulated by electromagnetic field analysis. Results of the simulation are shown in FIG. 4 and FIG. 5.

Figure 4:
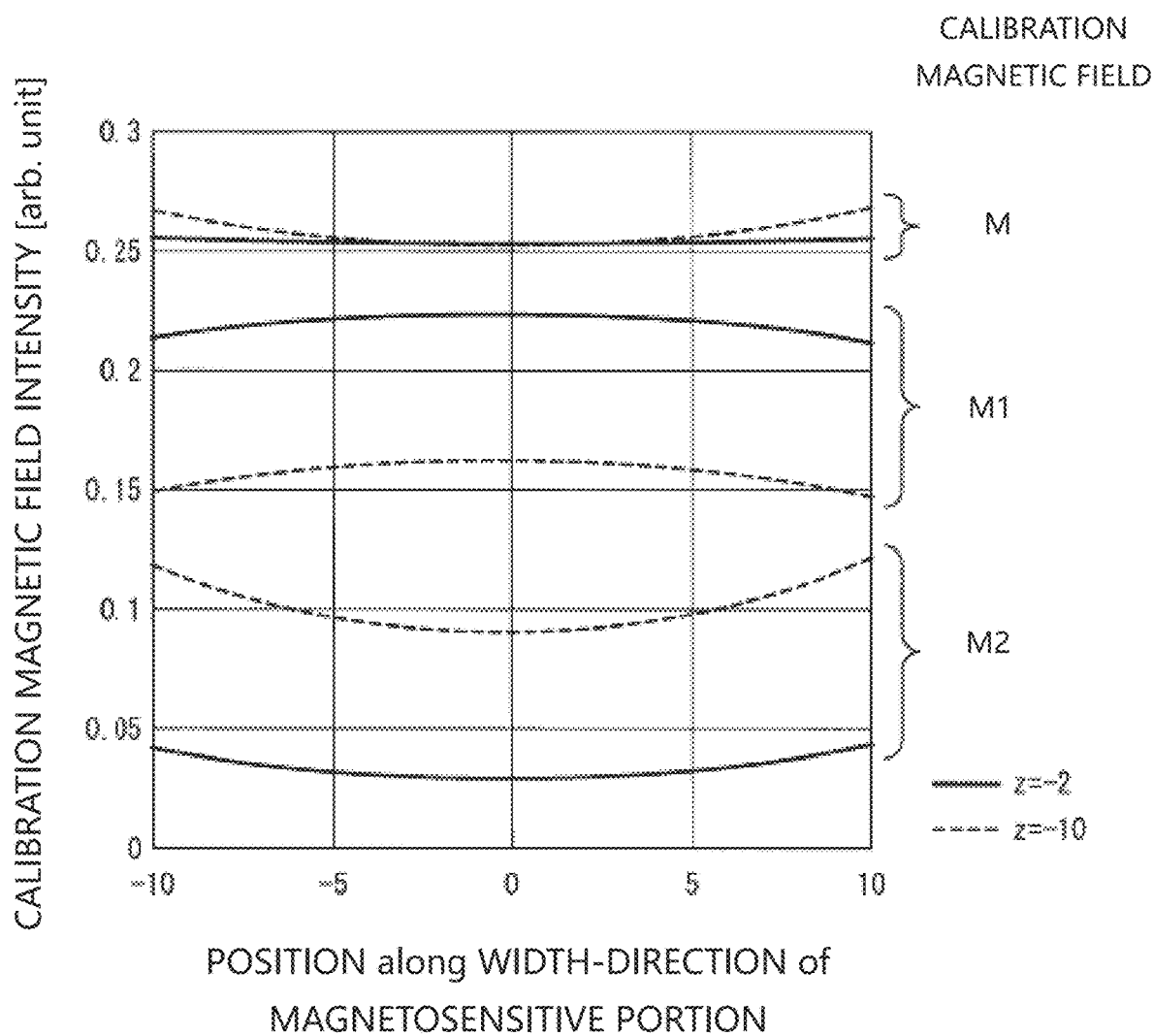
FIG. 4 is a graph for showing uniformity of the calibration magnetic fields in a width direction of the magnetosensitive portion.
Figure 5:
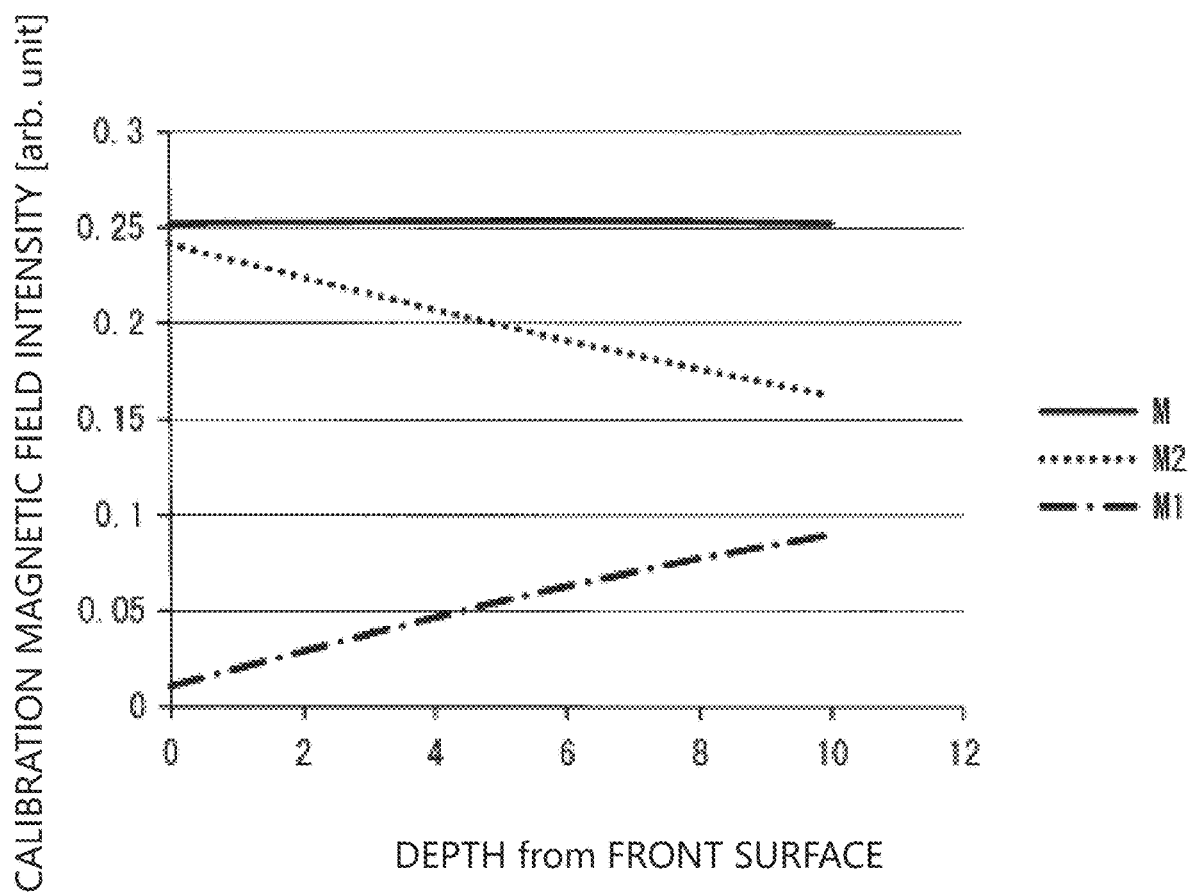
FIG. 5 is a graph for showing uniformity of the calibration magnetic fields in a depth direction of the magnetosensitive portion.

FIG. 4 is a graph for showing uniformity of the calibration magnetic fields in the width direction of the magnetosensitive portion 3a. FIG. 5 is a graph for showing uniformity of the calibration magnetic fields in the depth direction of the magnetosensitive portion 3a.

Specifically, in this simulation, the magnetosensitive portion 3a is set to have a width of 20 μm and a depth of 10 μm, the excitation wiring 4 is set to have a width of 20 μm, a thickness of 1 μm, and a distance of 2 μm from the front surface of the semiconductor substrate 2, and each of the excitation wirings 5 is set to have a width of 20 μm, a thickness of 0.5 μm, a distance of 0.5 μm from the front surface of the semiconductor substrate 2, and a center-to-center distance of 30 μm to the excitation wiring 4 (from the excitation wirings 5). Further, a ratio of the current flowing through the excitation wiring 4 and the current flowing through each of the excitation wirings 5 is set to 1:1.2.

In the graph of FIG. 4, the horizontal axis indicates a position X in the width direction of the magnetosensitive portion 3a. Specifically, a position in the width direction of the magnetosensitive portion 3a is expressed by the X coordinate in which the center position in the width direction of the magnetosensitive portion 3a is at the origin (X=0), a left end is at X=−10 μm, and a right end is at X=10 μm. Further, the vertical axis indicates the intensity (relative value) [arb. unit] of each of the calibration magnetic fields applied to the magnetosensitive portion 3a along the width direction. In the graph of FIG. 4, results of calculating the width direction intensities (relative values) [arb. unit] of the calibration magnetic fields applied to the magnetosensitive portion 3a with the depth from the front surface of the semiconductor substrate 2 being set to 2 µm and 10 µm are shown.

As shown in FIG. 4, it can be seen that, with the semiconductor device 1A according to the first embodiment, in the case of the depth of 2 µm that is relatively close to the front surface, variation in the intensity of a calibration magnetic field M as a combined magnetic field of the calibration magnetic fields M1 and M2 is suppressed along the width direction of the magnetosensitive portion 3a as compared to variation in the intensity of each of the calibration magnetic field M1 and the calibration magnetic fields M2. It can also be seen that, in the case of the depth of 10 µm that is relatively far from the front surface, intensity variation of the calibration magnetic field M is suppressed as compared to intensity variation of each of the calibration magnetic field M1 and the calibration magnetic fields M2 as in the case of the depth of 2 µm.

In FIG. 4, for reasons of ensuring clarity of the figure, for example, the calculation results at two points in the relatively shallow region and the relatively deep region are shown. However, it is confirmed that, at any depth between the front surface (depth: 0 µm) and the back surface (depth: 10 µm), the intensity variation of the calibration magnetic field M is suppressed more than the intensity variation of each of the calibration magnetic field M1 and the calibration magnetic fields M2.

The graph in FIG. 5 shows the intensities of the calibration magnetic field M1 generated by the excitation wiring 4, the calibration magnetic fields M2 generated by the excitation wirings 5, and the calibration magnetic field M as the combined magnetic field of the calibration magnetic fields M1 and M2 applied to the magnetosensitive portion 3a, which are results of the calculation at the center position of the magnetosensitive portion 3a in a range of from 0 µm to 10 µm in the depth direction from the front surface of the semiconductor substrate 2.

As shown in FIG. 5, in the depth direction of the magnetosensitive portion 3a of the semiconductor device 1A according to the first embodiment, the intensity of the calibration magnetic field M applied to the magnetosensitive portion 3a is substantially uniform.

As described above, in the semiconductor device 1A according to the first embodiment, by the superimposition of the calibration magnetic field M1 generated by the excitation wiring 4 and the calibration magnetic fields M2 generated by the excitation wirings 5, the intensity of the calibration magnetic field M applied to the magnetosensitive portion 3a can be increased. Further, in the semiconductor device 1A according to the first embodiment, the calibration magnetic field M having the substantially uniform intensity can be applied to the magnetosensitive portion 3a in the width direction of the magnetosensitive portion 3a. Further, in the semiconductor device 1A according to the first embodiment, the calibration magnetic field M having the substantially uniform intensity can be applied to the magnetosensitive portion 3a in the depth direction of the magnetosensitive portion 3a.

Consequently, in the semiconductor device 1A according to the first embodiment, the intensity of the calibration magnetic field applied to the magnetosensitive portion 3a can be increased, and the calibration magnetic field having more uniform intensity can be applied throughout the magnetosensitive portion 3a.

Second Embodiment

Figure 6:
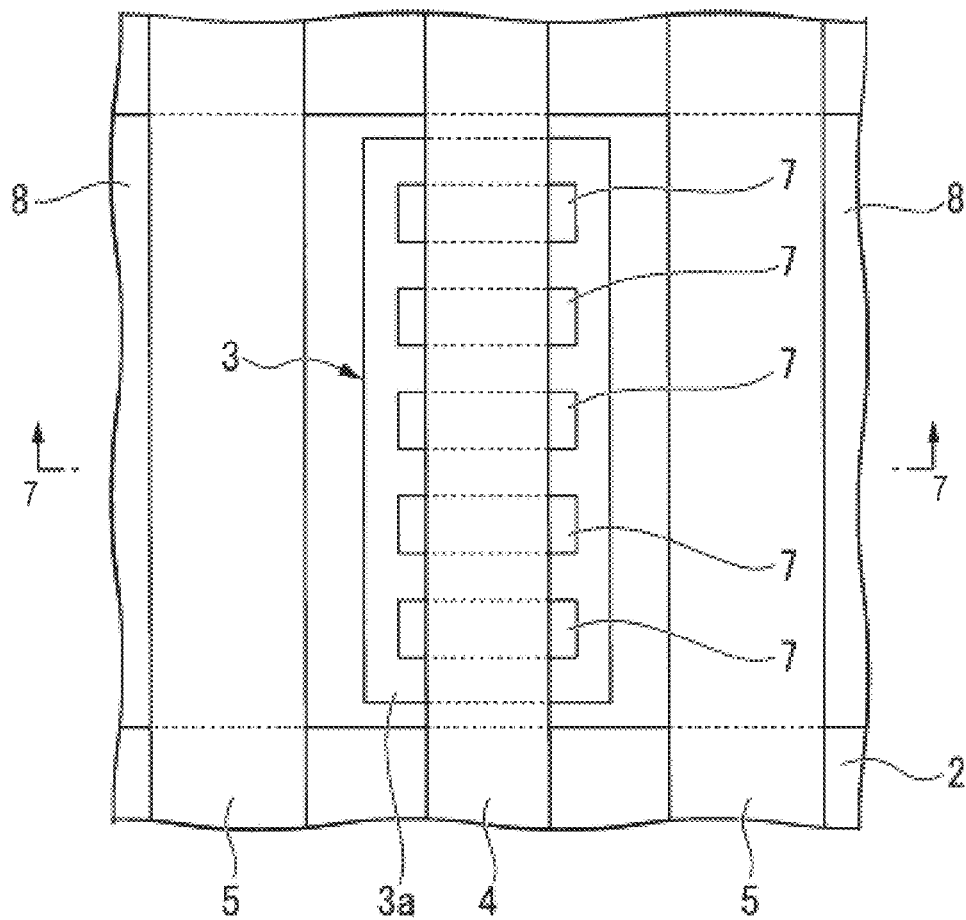
FIG. 6 is a plan view for illustrating a configuration of a semiconductor device according to the second embodiment of the present invention.
Figure 7:
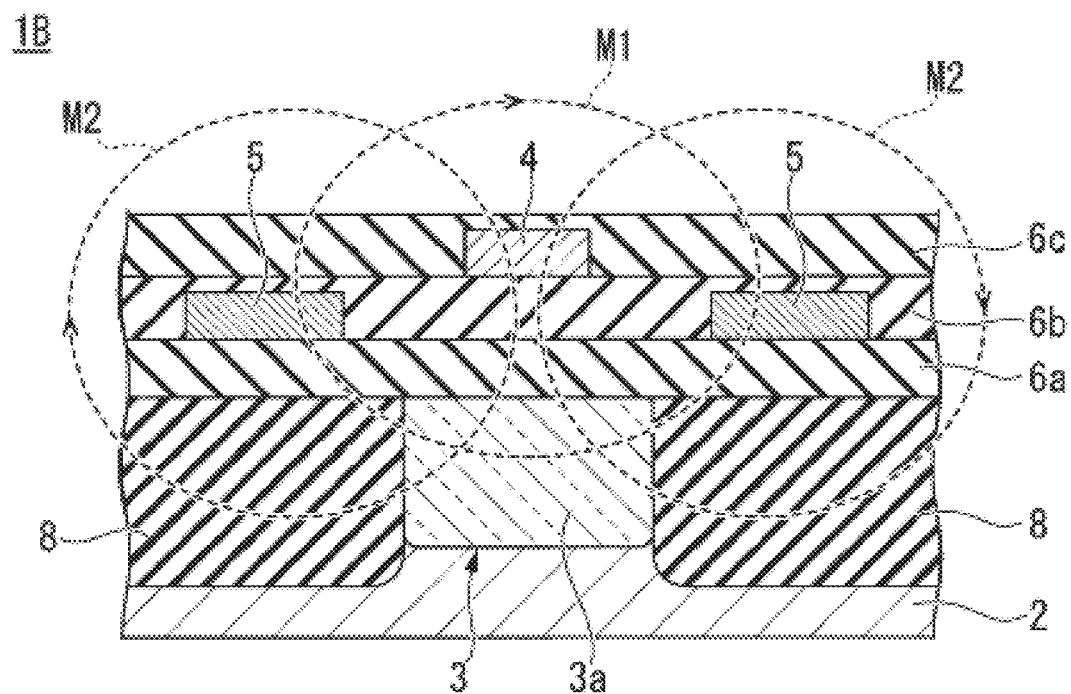
FIG. 7 is a sectional view of the semiconductor device taken along the line 7-7 of FIG. 6.

Next, as the second embodiment of the present invention, a semiconductor device 1B illustrated in FIG. 6 and FIG. 7 is described.

FIG. 6 is a plan view for illustrating a configuration of the semiconductor device 1B. FIG. 7 is a sectional view of the semiconductor device 1B taken along the line 7-7 of FIG. 6. Further, in the following description, equivalent components to those of the semiconductor device 1A described above are denoted by identical reference symbols in the drawings, and descriptions thereof are omitted.

As illustrated in FIG. 6 and FIG. 7, while the excitation wiring 4 and each of the excitation wirings 5 included in the semiconductor device 1A described above have the same width, the excitation wiring 4 and each of the excitation wirings 5 have different widths in the semiconductor device 1B according to the second embodiment. Specifically, the width of each of the two excitation wirings 5 is larger than the width of the excitation wiring 4. Other than the widths, the semiconductor device 1B has basically the same configuration as that of the semiconductor device 1A described above.

In the semiconductor device 1B according to the second embodiment, through adjustment of the width of the excitation wiring 4 and the width of each of the excitation wirings 5, the resistance ratio of the excitation wiring 4 and each of the excitation wirings 5 is adjusted to a desired resistance ratio. At this time, with application of the same voltage to the excitation wiring 4 and each of the excitation wirings 5, currents of a current ratio corresponding to the resistance ratio of the excitation wiring 4 and each of the excitation wirings 5 flow through the excitation wiring 4 and each of the excitation wirings 5.

With the above-mentioned configuration, in the semiconductor device 1B according to the second embodiment, the intensity of the calibration magnetic field applied to the magnetosensitive portion 3a of the vertical Hall element 3 can be increased as much as the semiconductor device 1A described above, and the calibration magnetic field having more uniform intensity can be easily applied throughout the magnetosensitive portion 3a.

Further, in the semiconductor device 1B according to the second embodiment, by the adjustment of the width of the excitation wiring 4 and the width of each of the excitation wirings 5, the resistance ratio of the excitation wiring 4 and each of the excitation wirings 5 can be adjusted to the desired resistance ratio. With application of the same voltage to the excitation wiring 4 and each of the excitation wirings 5, the currents of the current ratio corresponding to the resistance ratio of the excitation wiring 4 and each of the excitation wirings 5 can flow through the excitation wiring 4 and each of the excitation wirings 5. Consequently, according to the semiconductor device 1B of the second embodiment, the currents necessary to generate the uniform calibration magnetic field can be obtained from a single power supply.

In the semiconductor device 1B described above, the description is given of the case in which the width of each of the two excitation wirings 5 is larger than the width of the excitation wiring 4 as an example of the case in which the width of the two excitation wirings 5 are different from the width of the excitation wiring 4, but the width of each of the two excitation wirings 5 may be smaller than the width of the excitation wiring 4.

Further, in the semiconductor device 1B described above, the configuration in which the excitation wiring 4 includes one wiring portion, and in which each of the excitation wirings 5 includes one wiring portion on each of the left side and the right side of the excitation wiring 4, but the number of wiring portions forming each of the excitation wiring 4 and the excitation wirings 5 is not necessarily limited to the above-mentioned configuration. For example, the excitation wiring 4 may include a plurality of wiring portions, and the wiring portions may be connected in series to one another. Alternatively, each of the excitation wirings 5 may include a plurality of wiring portions, and the wiring portions may be connected in series to one another. At this time, the width of the excitation wiring 4 may be regarded as the number of wiring portions forming the excitation wiring 4. Similarly, the width of each of the excitation wirings 5 may be regarded as the number of wiring portions forming the excitation wiring 5.

Accordingly, in the semiconductor device 1B, the width and number of wiring portions forming each of the excitation wiring 4 and the excitation wirings 5 may be suitably adjusted. In the semiconductor device 1B, since the width and number of wiring portions forming the excitation wiring 4, and the width and number of wiring portions forming the excitation wirings 5 may be suitably adjusted, a desired magnetic field can be easily applied to the magnetosensitive portion 3a.

Further, with the plurality of wiring portions, a current necessary to apply a calibration magnetic field of the same magnetic field intensity to the magnetosensitive portion 3a can be reduced as compared to the case of one wiring portion. In other words, with the same current flow through one wiring portion, a calibration magnetic field having a high magnetic field intensity can be applied to the magnetosensitive portion 3a.

Third Embodiment

Figure 8:
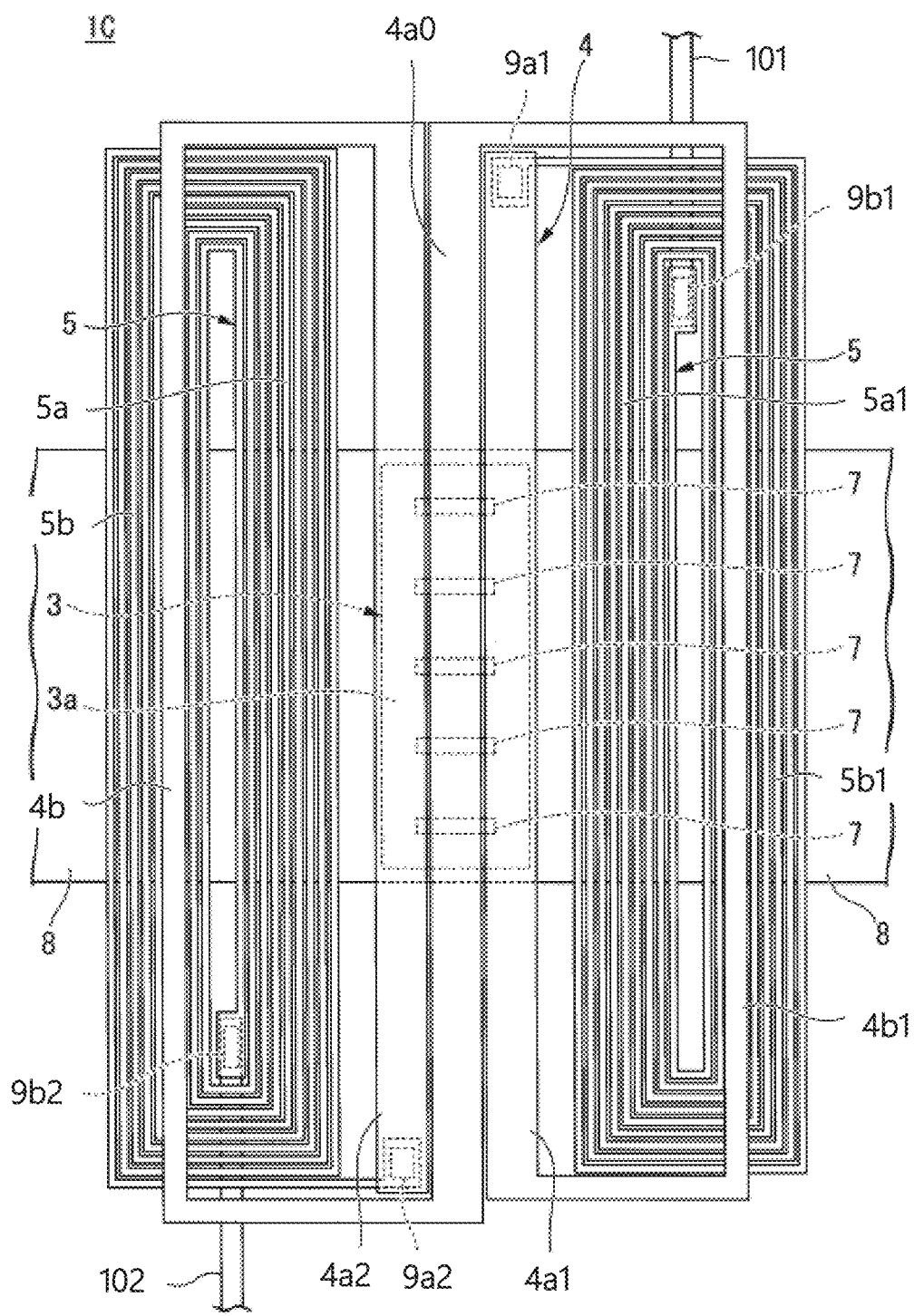
FIG. 8 is a plan view for illustrating a configuration of a semiconductor device according to the third embodiment of the present invention.

Next, as the third embodiment of the present invention, a semiconductor device 1C illustrated in FIG. 8 is described. FIG. 8 is a plan view for illustrating a configuration of the semiconductor device 1C. Further, in the following description, equivalent components to those of the semiconductor device 1A described above are denoted by identical reference symbols in the drawings, and descriptions thereof are omitted.

As illustrated in FIG. 8, the semiconductor device 1C according to the third embodiment has basically the same configuration as that of the semiconductor device 1A described above except that configurations of the excitation wiring 4 and the excitation wirings 5 are different.

Specifically, the excitation wiring 4 includes a plurality of wiring portions 4a (in the third embodiment, three) as first wiring portions. Further, the plurality of wiring portions 4a are arranged in parallel to one another above the vertical Hall element 3. The plurality of wiring portions 4a are electrically connected in series to one another through a plurality of wiring portions 4b the third embodiment, two).

The two excitation wirings 5 are arranged in parallel to each other on both sides of the plurality of wiring portions 4a forming the excitation wiring 4 as viewed in plan view. Each of the excitation wirings 5 includes a plurality of wiring portions 5a (in the third embodiment, nine) as second wiring portions. The plurality of wiring portions 5a are electrically connected in series to one another through a plurality of wiring portions 5b (in the third embodiment, nine).

Further, the excitation wiring 4 and the two excitation wirings 5 are electrically connected in series to each other so that current flows through the plurality of wiring portions 4a and the plurality of wiring portions 5a in the same direction.

Specifically, of the three wiring portions (4a0, 4a1, 4a2) forming the excitation wiring 4, the proximal end of the wiring portion 4a0 located at the center is electrically connected to the distal end of the wiring portion 4a1 located on one side of the center through one wiring portion 4b1. Further, the distal end of the wiring portion 4a0 located at the center is electrically connected to the proximal end of the wiring portion 4a2 located on the other side of the center through another wiring portion 4b2.

Of the two excitation wirings 5, on one excitation wiring 5, the proximal end of a wiring portion 5b1 located at the outermost periphery is electrically connected to the proximal end of the wiring portion 4a1 located on one side of the center through the proximal contact portion 9a1. Similarly, on the other excitation wiring 5, the distal end of a wiring portion 5b2 located at the outermost periphery is electrically connected to the distal end of the wiring portion 4a2 located on the other side of the center through the distal contact portion 9a2. The contact portions 9a1, 9a2 are made by embedding the hole portions, which are formed in the interlayer insulating layer 6b, with metal.

On the one excitation wiring 5, the proximal end of the wiring portion 5a1 located at the innermost periphery is electrically connected to the proximal end of one lead-out wiring 101 arranged below the excitation wiring 5 through the proximal contact portion 9b1. Further, on the other excitation wiring 5, the distal end of the wiring portion 5a2 located at the innermost periphery is electrically connected to the distal end of the other lead-out wiring 102 arranged below the excitation wiring 5 through the distal contact portion 9b2. The lead-out wirings 101, 102 are provided on, for example, the front surface of the semiconductor substrate 2, and are electrically connected to the contact portions 9b1, 9b2. The contact portions 9b1, 9b2 are made by embedding the hole portions, which are formed in the interlayer insulating layer 6a, with metal.

With the semiconductor device 1C according to the third embodiment having the above-mentioned configuration, by superimposing the calibration magnetic field M1 generated by the plurality of wiring portions 4a forming the excitation wiring 4 and the calibration magnetic fields M2 generated by the plurality of wiring portions 5a forming the excitation wirings 5, the calibration magnetic field applied to the magnetosensitive portion 3a can be increased, and the calibration magnetic field adjusted to have a more uniform intensity can be applied to the magnetosensitive portion 3a.

Further, in the semiconductor device 1C according to the third embodiment in which the excitation wirings 4 and 5 are electrically connected in series, only through adjustment of the shapes, arrangement, and number of wiring portions 4a and 5a, the calibration magnetic field adjusted to have a more uniform intensity with high accuracy can be applied to the magnetosensitive portion 3a without depending on a value of the current flowing through the excitation wirings 4 and 5. Further, since the current flows through the plurality of wiring portions 4a and 5a forming the excitation wirings 4 and 5 in the same direction, a large calibration magnetic field can be applied to the magnetosensitive portion 3a with a smaller amount of current.

As described above, with the semiconductor device 1C according to the third embodiment, the intensity variation of the calibration magnetic field applied to the magnetosensitive portion 3a can be suppressed as much as the semiconductor device 1A described above. Consequently, with the semiconductor device 1C according to the third embodiment, the intensity of the calibration magnetic field applied to the magnetosensitive portion 3a can be increased, and the calibration magnetic field having the more uniform intensity can be applied throughout the magnetosensitive portion 3a.

In the semiconductor device 1C described above, the configuration in which the lead-out wirings 101, 102 are arranged on the front surface of the semiconductor substrate 2 is described by way of example, but it is only necessary that the lead-out wirings 10 are arranged at a position at which the lead-out wirings 10 can be arranged above the semiconductor substrate 2.

Further, in the semiconductor device 1C described above, the configuration in which the excitation wiring 4 and the excitation wirings 5 include the plurality of wiring portions 4a and the plurality of wiring portions 5a, respectively, is described by way of example, but the configuration of the excitation wiring 4 and the excitation wirings 5 is not necessarily limited to the above-mentioned configuration. For example, the excitation wiring 4 and the excitation wirings 5 may have a configuration in which the excitation wiring 4 includes a plurality of wiring portions 4a, and in which each of the excitation wirings 5 includes one wiring portion 5a, or a configuration in which the excitation wiring 4 includes one wiring portion 4a, and in which each of the excitation wirings 5 includes a plurality of wiring portions 5a.

Further, the above-mentioned configuration of the semiconductor device 1C is also applicable to the semiconductor devices 1A and 1B described above. In other words, the semiconductor devices 1A and 1B described above may have a configuration in which the excitation wiring 4 and the excitation wirings 5 are electrically connected in series.

The present invention is not necessarily limited to the embodiment described above. The embodiments may be modified in various ways without departing from the spirit of the present invention.

For example, in the embodiments described above, the semiconductor devices 1A to 1C in which the semiconductor layer (well) is formed by implanting into the semiconductor substrate 2 having the first conductivity type, impurities of the second conductivity type are described by way of example, but the semiconductor layer is not necessarily limited to the above-mentioned configuration. For example, the semiconductor layer may be formed in the semiconductor substrate 2 through forming an epitaxial layer on the semiconductor substrate 2.

Further, in the semiconductor devices 1A to 1C described above, each of the above-mentioned excitation wirings 4 and 5 (wiring portions 4a and 5a) is formed as a single layer in a thickness direction but may be formed as a plurality of layers in the thickness direction.

Further, in the semiconductor devices 1A to 1C described above, the two excitation wirings 5 are arranged on both sides of the excitation wiring 4 as viewed in the plan view, that is, one excitation wiring 5 is arranged on each of the left side and the right side of the above-mentioned excitation wiring 4, but the present invention is not necessarily limited to such a configuration. For example, a plurality of excitation wirings 5 may be arranged side by side on each of the left side and the right side of the excitation wiring 4. Further, the number of excitation wirings 5 arranged on the left side of the excitation wiring 4, and the number of excitation wirings 5 arranged on the right side of the excitation wiring 4 may not necessarily be the same.

Further, in the semiconductor devices 1A to 1C described above, the above-mentioned excitation wiring 4 is arranged above the excitation wirings 5, but the excitation wiring 4 may be arranged below the excitation wirings 5.

Further, in the semiconductor devices 1A to 1C described above, the center position in the width direction of the excitation wiring 4 and the center position in the width direction of the magnetosensitive portion 3a match as viewed in the plan view, and the excitation wirings 5 are arranged side by side symmetrically with respect to the excitation wiring 4. However, the present invention is not necessarily limited to such configurations.

For example, the center position in the width direction of the excitation wiring 4 may be arranged to be offset from a center position in the width direction of the excitation wirings 5 as viewed in plan view, or may be arranged asymmetrically with respect to the center position in the width direction of the magnetosensitive portion 3a as viewed in plan view. Also in this case, since the calibration magnetic field can be adjusted with the shapes, arrangement, and number of the excitation wirings 4 and 5 (wiring portions 4a and 5a) described above, and the magnitude of the current flowing through the excitation wirings 4 and 5, the adjustment can be made to apply the calibration magnetic field having the more uniform intensity throughout the magnetosensitive portion 3a.

Further, in the semiconductor devices 1A to 1C described above, the vertical Hall element 3 includes five electrodes 7. However, the present invention is not necessarily limited to such a configuration, and the number of electrodes 7 included in the vertical Hall element 3 may be at least two for supplying a drive current and one for providing the Hall voltage. In other words, it is only necessary that the vertical Hall element 3 includes the magnetosensitive portion 3a and at least three electrodes 7.

What is claimed is:

1. A semiconductor device, comprising:
   a semiconductor substrate;
   a vertical Hall element formed in the semiconductor substrate, and having a magneto sensitive portion;
   a first excitation wiring disposed above the magnetosensitive portion, wherein a center position in a width direction of the first excitation wiring matches a center position in the width direction of the magnetosensitive portion, and wherein the first excitation wiring is configured to apply a first magnetic field to the magnetosensitive portion;
   a second excitation wiring disposed above the magnetosensitive portion on a first side of the first excitation wiring along the first excitation wiring as viewed in plan view from immediately above a front surface of the semiconductor substrate, and configured to apply a second magnetic field to the magneto sensitive portion;
   a third excitation wiring disposed above the magnetosensitive portion on a second side of the first excitation wiring along the first excitation wiring as viewed in plan view from immediately above the front surface of the semiconductor substrate wherein the second side is opposite the first side, and wherein the third excitation wiring is configured to apply a third magnetic field to the magnetosensitive portion; and
   wherein the second excitation wiring and the third excitation wiring are disposed symmetrically with respect to the first excitation wiring as viewed in the plan view.

2. The semiconductor device according to claim 1, wherein the second excitation wiring and the third excitation wiring are disposed outside of the magneto sensitive portion as viewed in the plan view.

3. The semiconductor device according to claim 1, wherein the first excitation wiring is disposed higher than the second excitation wiring and the third excitation wiring with respect to the magnetosensitive portion.

4. The semiconductor device according to claim 1, wherein the first excitation wiring is electrically connected in series to the second excitation wiring and the third excitation wiring.

5. The semiconductor device according to claim 1, wherein the first excitation wiring comprises a plurality of first wiring portions disposed in parallel to one another, the plurality of first wiring portions being electrically connected in series to one another.

6. The semiconductor device according to claim 1, wherein the second excitation wiring comprises a plurality of second wiring portions disposed in parallel to one another, the plurality of second wiring portions being electrically connected in series to one another; and
wherein the third excitation wiring comprises a plurality of third wiring portions disposed in parallel to one another, the plurality of third wiring portions being electrically connected in series to one another.

7. The semiconductor device according to claim 2, wherein the second excitation wiring and the third excitation wiring are disposed symmetrically with respect to the first excitation wiring as viewed in the plan view.

8. The semiconductor device according to claim 1, wherein the first excitation wiring is disposed higher than the second excitation wiring and the third excitation wiring with respect to the magnetosensitive portion.

9. The semiconductor device according to claim 3, wherein the first excitation wiring is electrically connected in series to the second excitation wiring and the third excitation wiring.

10. The semiconductor device according to claim 4, wherein the first excitation wiring comprises a plurality of first wiring portions disposed in parallel to one another, the plurality of first wiring portions being electrically connected in series to one another.

11. The semiconductor device according to claim 5, wherein each of the second excitation wiring comprises a plurality of second wiring portions disposed in parallel to one another, the plurality of second wiring portions being electrically connected in series to one another; and
wherein the third excitation wiring comprises a plurality of third wiring portions disposed in parallel to one another, the plurality of third wiring portions being electrically connected in series to one another.

* * * * *